(12) United States Patent
Jiang et al.

(10) Patent No.: US 9,019,740 B2
(45) Date of Patent: Apr. 28, 2015

(54) MEMORY AND METHOD OF OPERATING THE SAME

(71) Applicant: Grace Semiconductor Manufacturing Corporation, Shanghai (CN)

(72) Inventors: Hong Jiang, Shanghai (CN); Yi Xu, Shanghai (CN); Jun Xiao, Shanghai (CN); Weiran Kong, Shanghai (CN); Binghan Li, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 207 days.

(21) Appl. No.: 13/680,547

(22) Filed: Nov. 19, 2012

(65) Prior Publication Data

US 2013/0223122 A1    Aug. 29, 2013

(30) Foreign Application Priority Data

Feb. 28, 2012    (CN) .......................... 2012 1 0048689

(51) Int. Cl.
| | | |
|---|---|---|
| *G11C 5/06* | (2006.01) | |
| *G11C 7/18* | (2006.01) | |
| *H01L 27/115* | (2006.01) | |
| *G11C 7/00* | (2006.01) | |
| G11C 16/04 | (2006.01) | |
| H01L 21/28 | (2006.01) | |

(52) U.S. Cl.
CPC .. *G11C 5/06* (2013.01); *G11C 7/00* (2013.01); *G11C 7/18* (2013.01); *G11C 16/0416* (2013.01); *H01L 21/28273* (2013.01); *H01L 21/28282* (2013.01); *H01L 27/11519* (2013.01); *H01L 27/11565* (2013.01)

(58) Field of Classification Search
CPC ........ G11C 5/06; G11C 7/18; G11C 16/0408; G11C 16/0458; H01L 29/788; H01L 27/11517
USPC ............ 365/63, 72, 189.011, 189.04, 185.05; 257/315, 316, 365, 401, E29.264, 257/E29.3, E27.103
See application file for complete search history.

(56) References Cited

U.S. PATENT DOCUMENTS

| | | | | |
|---|---|---|---|---|
| 6,147,903 | A * | 11/2000 | Takahashi | ................ 365/185.05 |
| 6,388,283 | B1 * | 5/2002 | Owen | ........................... 257/301 |
| 6,518,619 | B2 * | 2/2003 | Verhaar et al. | ................ 257/316 |
| 6,522,585 | B2 * | 2/2003 | Pasternak | ................ 365/185.21 |
| 6,563,736 | B2 * | 5/2003 | Hsu et al. | ................ 365/185.18 |
| 6,573,557 | B1 * | 6/2003 | Watanabe | ...................... 257/318 |
| 6,927,443 | B2 * | 8/2005 | Arigane et al. | ............... 257/300 |
| 7,352,619 | B2 * | 4/2008 | Ho | ........................... 365/185.03 |
| 8,750,041 | B2 * | 6/2014 | Georgescu et al. | ...... 365/185.05 |
| 2005/0253183 | A1 * | 11/2005 | Umezawa et al. | ............ 257/315 |
| 2007/0127290 | A1 * | 6/2007 | Kato | ........................ 365/185.03 |

* cited by examiner

*Primary Examiner* — Allison P Bernstein
(74) *Attorney, Agent, or Firm* — Harness, Dickey & Pierce, P.L.C.

(57) ABSTRACT

A memory includes an array of memory cells including a plurality of memory cells with a common source, wherein each of the plurality of memory cells with a common source includes two sub-memory cells, each of the sub-memory cells corresponds to a bit line, and the respective bits are electrically independent. Each of the sub-memory cells in the memory according to the disclosure corresponds to a bit line, and the respective bit lines are electrically independent, thereby effectively avoiding interference to other memory cells which will not be programmed during a program operation.

17 Claims, 3 Drawing Sheets

MEMORY AND METHOD OF OPERATING THE SAME

CROSS REFERENCE TO RELATED APPLICATIONS

The present application claims priority to Chinese Patent Application No. CN201210048689.6, filed on Feb. 28, 2012, and entitled "MEMORY AND METHOD FOR OPERATING THE SAME", the entire disclosure of which is incorporated herein by reference.

FIELD OF THE DISCLOSURE

The present disclosure relates to the field of fabricating a semiconductor and particularly to a memory and a method of operating the same.

BACKGROUND OF THE DISCLOSURE

At present, various types of memories have been developed, e.g., a Random Access Memory (RAM), a Dynamic Random Access Memory (DRAM), a Read Only Memory (ROM), an Electrically Programmable Read Only Memory (EPROM), a FLASH memory, etc., as long with continued development of memory technologies.

The majority of semiconductor memories include various types of circuits, e.g., memory circuits and peripheral circuits. A typical flash memory includes arrays of memory cells, and these arrays of memory cells include a number of memory cells arranged in blocks. Each memory cell is fabricated as a field effect transistor including a control gate and a floating gate. The floating gate is used to store charges and separated from source and drain areas included in a substrate by a thin oxide layer. Such a memory cell can perform various operations including programming, reading, erasing, etc. For example, electrons may be injected on the floating gate from the drain area through the oxide layer to electrically charge the memory cell. During the erase operation, electrons are tunneled to the gate through the oxide layer in the prior art to thereby remove charges from the floating gate. Thus data in the memory cell is determined by presence or absence of charges on the floating gate.

FIG. 1 illustrates a schematic structural diagram of a conventional type of memory device. Referring to FIG. 1, the memory device includes two memory cells M1 and M2 formed on a P-type semiconductor substrate 100 in which there are formed a first diffusion area 120 and a second diffusion area 130, both of which are of N-type. The first diffusion area 120 is a common source area common to the two memory cells M1 and M2, and the second diffusion area 130 is a drain area. The memory cells M1 and M2 have a mirrored structure relative to the first diffusion area 120 (i.e. the common source area).

Specifically each of the memory cells M1 and M2 includes a channel area 140, a floating gate 150, a control gate 160, a gate insulating layer 170, and a poly-oxide layer 180 and an insulating oxide layer 190 formed on the floating gate 150, all of which are located between the first diffusion area 120 and the second diffusion area 130.

Particularly the floating gate 150 is an electrically isolated gate electrode and located on the semiconductor substrate 100 between the first diffusion area 120 and the second diffusion area 130, and has a first side partially overlapping with the first diffusion area 120. The control gate 160 is located on the semiconductor substrate 100 between a second side of the floating gate 150 and the second diffusion area 130. The insulating oxide layer 190 is located between the control gate 160 and the second side of the floating gate 150 and covers a sidewall of the floating gate 150 and a part of the channel area 140. The gate insulating layer 170 is located between the floating gate 150 and the semiconductor substrate 100 to insulate the floating gate 150 and the control gate 160 from the semiconductor substrate 100. And the poly-oxide layer 180 is formed on the floating gate 150 in a local oxidization of silicon (LOCOS) process.

In a conventional design, each control gate 160 is a Word Line (WL) (not illustrated in FIG. 1) extending in a row direction (the direction A-A' as illustrated in FIG. 1) and is connected jointly in the row to the respective memory cell. An interlayer dielectric layer 110 is formed above the memory cells M1 and M2. A common source line 220 is connected to the first diffusion area 120 (the common source area) through a contact plug 210 and extends in the same direction as the control gate 160 (i.e., the word line). A connection node (not illustrated in FIG. 1) is formed on the second diffusion area 130 (the drain area) and connected through a Bit Line (BL) and extends in a column direction (the direction B-B' as illustrated in FIG. 1).

In the memory device illustrated in FIG. 1, the two connection nodes in the memory cells M1 and M2 are connected jointly to the same bit line BL, so that the memory cells M1 and M2 share the same bit line. In this structure, the memory cells M1 and M2 are programmed respectively with the separate word lines, thus easily incurring crosstalk to another sub-memory cell located in the same column or row or diagonally with a programmed (selected) sub-memory cell.

SUMMARY OF THE DISCLOSURE

An embodiment of the disclosure provides a memory including an array of memory cells including a plurality of memory cells with a common source, wherein each of the plurality of memory cells with a common source includes two sub-memory cells, each of the sub-memory cells corresponds to a bit line, and the respective bits are electrically independent.

Optionally the two sub-memory cells of the memory cell with a common source share a word line.

Optionally the two sub-memory cells of adjacent memory cells with a common source in the direction of a column of the array of memory cells share a bit line.

Optionally two adjacent columns of memory cells with a common source in the direction of a row of the array of memory cells are connected with the bit lines in a mirrored-symmetric way.

Optionally two adjacent columns of memory cells with a common source in the direction of a row of the array of memory cells are connected with the bit lines in the same way.

Optionally the memory further includes a plurality of common source lines electrically connected with each other.

Optionally the memory further includes a plurality of common source lines, one of which the two sub-memory cells with a common source share and which are electrically independent of each other.

Optionally the memory includes a poly-silicon memory, an SONOS memory or a nano-crystal memory.

An embodiment of the disclosure further provides a method of operating a memory, the method of operating a memory including: applying a word line voltage on word lines of two sub-memory cells with a common source; applying a common source line voltage on a common source line; and applying a corresponding bit line voltage or bit line current on two bit lines corresponding to the two sub-memory cells with a common source, wherein the two sub-memory cells with a common source correspond respectively to the two word lines and the two bit lines, and the two word lines are electrically independent of each other and the two bit lines are electrically independent of each other.

Optionally during programming of one of the two sub-memory cells with a common source, a supply voltage is applied on the bit line corresponding to the other sub-memory cell.

Optionally applying the corresponding bit line voltage or bit line current on the two bit lines corresponding to the two sub-memory cells with a common source includes: applying the same bit line voltage or the same bit line current concurrently on the two bit lines corresponding to the two sub-memory cells with a common source during programming of the memory.

Optionally applying the corresponding bit line voltage or bit line current on the two bit lines corresponding to the two sub-memory cells with a common source includes: applying the same read voltage or read current concurrently on the bit lines of the sub-memory cells with a common source to concurrently read out data in the sub-memory cells with a common source.

An embodiment of the disclosure further provides another method of operating a memory, the method of operating a memory including: applying a word line voltage on word lines corresponding to two sub-memory cells with a common source; applying a common source line voltage on a common source line; and applying a corresponding bit line voltage or bit line current on two bit lines corresponding to the two sub-memory cells with a common source, wherein the two sub-memory cells with a common source correspond to the two bit lines, and the two bit lines are electrically independent; and the word lines corresponding to the two sub-memory cells with a common source are connected.

Optionally during programming of one of the two sub-memory cells with a common source, a supply voltage is applied on the bit line corresponding to the other sub-memory cell.

The foregoing technical solutions have at least the following advantages over the prior art: each of sub-memory cells in a memory according to the disclosure corresponds to a bit line, and the respective bit lines are electrically independent, so two sub-memory cells sharing a common source line can be read or programmed concurrently; and in this structure, during programming of one of sub-memory cells of a memory cell with a common source, a supply voltage can be applied on the bit line of another sub-memory cell to thereby avoid crosstalk between the adjacent sub-memory cells.

DETAILED DESCRIPTION OF THE EMBODIMENTS

As can be apparent from the foregoing analysis, the two memory cells M1 and M2 with a common source in the memory of the prior art are programmed respectively with the separate word lines, and during programming of one of the memory cells in this structure, the other memory may incur crosstalk due to the same bit line voltage or bit line current applied on the bit line.

Each of sub-memory cells with a common source in a memory according to the disclosure corresponds to a bit line, and the respective bit lines are electrically independent. In this structure, the memory cells with a common source can be programmed or read respectively with the separate bit lines, and during programming of one of the sub-memory cells with a common source, a supply voltage can be applied on the bit line of another sub-memory cell to thereby avoid crosstalk between these two sub-memory cells.

Embodiments of the disclosure will be detailed below with reference to the drawings to make the foregoing objects, features and advantages of the disclosure become more apparent.

Numerous specific details will be set forth in the following description to facilitate full understanding of the disclosure, but the disclosure can alternatively be embodied in other embodiments than those described here and thus will not be limited to the embodiments disclosed below.

First Embodiment

Figure 1:
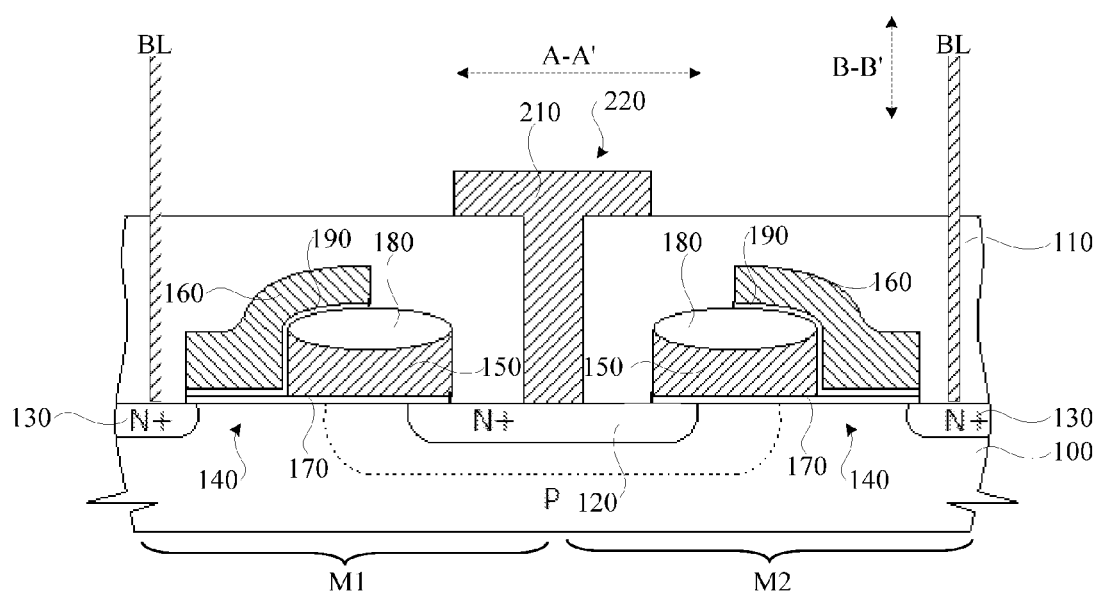
FIG. 1 is a schematic structural diagram of a common type memory.
Figure 2:
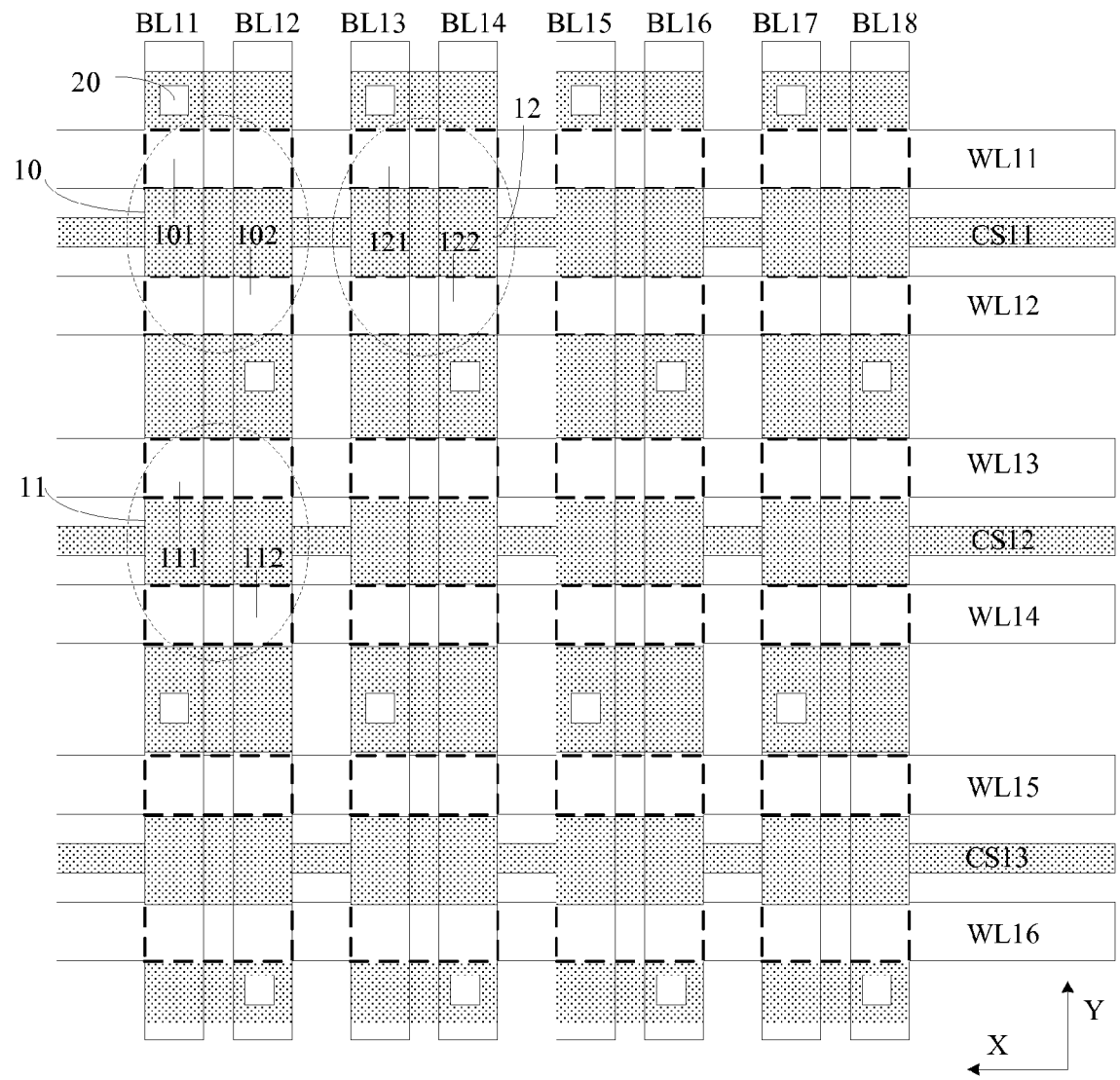
FIG. 2 is a schematic structural diagram of a memory according to an embodiment of the disclosure in a top view.

FIG. 2 is a schematic structural diagram of a memory according to an embodiment of the disclosure in a top view. Referring to FIG. 2, the memory includes an array of memory cells including a plurality of memory cells with a common source, each of the plurality of memory cells with a common source includes two sub-memory cells, each of the sub-memory cells corresponds to a bit line, and the respective bits are electrically independent.

Specifically, the memory cell 10 with a common source includes a sub-memory cell 101 corresponding to a bit line BL11 and a sub-memory cell 102 corresponding to a bit line BL12 as illustrated in FIG. 2. The respective sub-memory cells and their corresponding bit lines are electrically connected respectively through connection nodes 20. Moreover the respective bit lines (BL11 to BL18) are electrically independent of each other in this embodiment.

Further referring to FIG. 2, the memory further includes a plurality of word lines (WL11 to WL16) and a plurality of common source lines (CS11, CS12 and CS13) in this embodiment. The respective word lines (WL11 to WL16) and the respective common source lines (CS11, CS12 and CS13) are arranged in line respectively in the array of memory cells, i.e., the direction X illustrated in FIG. 2.

Particularly the common source lines (CS11, CS12 and CS13) can be used for electrical connection throughout the array or common only to a pair of sub-memory cells with a common source as illustrated in FIG. 2 without departing from the scope of the disclosure.

Moreover in this embodiment, a pair of word lines with a common source (e.g., W11 and W12), that is, two sub-memory cells with a common source (e.g., the sub-memory cell 101 and the sub-memory cell 102), can share a word line. Thus a common word line voltage can be applied to the two sub-memory cells with a common source to program the sub-memory cells with a common source to thereby eliminate crosstalk to the other sub-memory cell located in the same column or row as or diagonally to the programmed (selected) sub-memory cell in a traditional structure.

Of course in another embodiment, two sub-memory cells of a memory cell without a common source can also share the same word line for electrical connection. Referring to FIG. 2, for example, the word line WL12 can also be connected with the word line WL 13 to thereby enable the sub-memory cell 102 and the sub-memory cell 111 without a common source to share a word line.

The arrangement of the word lines has been described above by way of an example, but the scope of the disclosure shall not be limited thereto, and those skilled in the art can alternatively arrange the word lines in the array of memory cells otherwise in other embodiments without departing from the scope of the disclosure. Referring to FIG. 2, for example, the respective word lines (WL11 to WL16) of the memory are electrically independent of each other instead of being electrically connected with each other.

In this embodiment, the common source lines (CS11, CS12 and CS13) are common only to a pair of sub-memory cells with the same source, for example, the common source line CS11 is common only to the sub-memory cell 101 and the sub-memory cell 102 with a common source, and the common source lines (CS11, CS12 and CS13) are electrically independent of each other, that is, the common source lines (CS11, CS12 and CS13) are not electrically connected with each other. In this structure, memory cells with a common source in the memory share the same common source line in the direction of a row, i.e., the direction X, and as illustrated in FIG. 2, the memory cell 10 with a common source and the memory cell 12 with a common source are two adjacent memory cells with a common source located in the direction of a row in the array of memory cells, and these two memory cells with a common source share the same common source line CS11. Interference to memory cells in another row can be avoided effectively in this structure.

In this embodiment, the two sub-memory cells 101 and 102 in the memory cell 10 with a common source can be programmed or read concurrently.

In a specific example, a source voltage, e.g., 9V, can be applied on the common source line CS11, a specific word line voltage, e.g., 1.5V, can be applied concurrently to the word lines WL11 and WL12, and a specific bit line voltage, e.g., 0.5V, can be applied concurrently to the bit lines BL11 and BL12, during a program operation. The same data can be written concurrently into the sub-memory cells 101 and 102 under such a condition.

In another specific example, a 0V voltage can be applied on the common source line CS11, a specific word line voltage, e.g., 1.8V, can be applied concurrently to the word lines WL11 and WL12, and a specific bit line voltage, e.g., 0.8V, can be applied concurrently to the bit lines BL11 and BL12, during a read operation. Data in the sub-memory cells 101 and 102 can be correctly read concurrently under such a condition.

It shall be noted that corresponding bit line currents can be applied on the other bit lines in addition to the bit line currents applied in the foregoing examples during programming or reading of a memory cell. This is well known to those skilled in the art, and thus a repeated description thereof will be omitted here.

Moreover in the memory of this embodiment, a high voltage can be applied on the bit line corresponding to the other sub-memory cell which will not be programmed in order to avoid crosstalk to the sub-memory cell which is not programmed during the programming operation.

In a specific example, assumed the sub-memory cell 101 will be programmed, and the sub-memory cell 102 is a sub-memory cell which will not be programmed. At this time a specific word line voltage, e.g., 1.5V is applied on the word line WL11 of the sub-memory cell 101 to select the sub-memory cell 101; a common source voltage, e.g., 9V, is applied on the common source line CS11; and a bit line voltage, e.g., 0.8V, is applied on the bit line BL11 corresponding to the sub-memory cell 101.

Since the word lines WL11 and WL12 are connected with each other in this embodiment, the word line voltage is also applied on the word line WL12 of the sub-memory cell 102, that is, the voltage on the sub-memory cell 102 is also 1.5V at this time, where a supply voltage, e.g., 3V, can be applied on the bit line BL12 corresponding to the sub-memory cell 102. Thus the difference between the word line voltage and the bit line voltage of the sub-memory cell 102 can be made far above a threshold voltage of the sub-memory cell 102 to thereby effectively avoid crosstalk during a program operation.

In the prior art, two sub-memory cells share a bit line, and thus during programming of one of the sub-memory cells, the other sub-memory cell which is not programmed may be subject to some interference, and consequently the sub-memory cell which is not programmed may be subject to crosstalk, thus degrading the correction ratio of stored data; and in the disclosure, each of the sub-memory cells corresponds to a bit line, and the respective bit lines are electrically independent, thereby effectively avoiding interference of voltage or current on a bit line of a sub-memory cell adjacent thereto.

In this embodiment, two adjacent sub-memory cells in adjacent memory cells with a common source in the direction of a column of the array of memory cells, i.e., the direction Y illustrated in FIG. 2, share a bit line. Specifically, the memory cell 10 with a common source and the memory cell 11 with a common source are adjacent in the direction of a column of the array of memory cells referring to FIG. 2. The sub-memory cell 102 in the memory cell 10 with a common source is adjacent with the sub-memory cell 111 in the memory cell 11 with a common source, and in this embodiment, the sub-memory cell 102 and the sub-memory cell 111 share the bit line BL11. Moreover in this embodiment, the memory cells with a common source in this structure extend in parallel in the direction of a column.

Of course, the scope of the disclosure will not be limited to the arrangement of the bit lines in the direction of a column of the memory cells in this embodiment, but the bit lines can alternatively be arranged otherwise in other embodiments.

Moreover in this embodiment, two adjacent columns of memory cells with a common source in the direction of a column of the array of memory cells, i.e., the direction X illustrated in FIG. 2, are connected with bit lines in the same way. Referring to FIG. 2, the memory cell 10 with a common source and the memory cell 12 with a common source are adjacent in the direction of a column of the array of memory cells and connected with their respective bit lines in the same way. More specifically the two connection nodes in the memory cell 10 with a common source have the same locations as the two connection nodes in the memory cell 12 with a common source, in other words, two sub-memory cells 121 and 122 in the memory cell 12 with a common source can be structured from parallel extension of the two sub-memory cells 101 and 102 in the memory cell 120 with a common source. In this embodiment, the memory cells with a common source in this structure extend in parallel in the direction of a row. Of course the memory cells with a common source can alternatively be structurally modified otherwise in the direction of a row of the array of memory cells in other embodiments without departing from the scope of the disclosure.

It shall be noted that the memory in this embodiment can be a poly-silicon memory, a Silicon-Oxide-Nitride-Oxide-Silicon (SONOS) memory, a nano-crystal memory, etc. The scope of the disclosure will not be limited to any specific type, material, etc., of the memory.

In this embodiment, the memory cells with a common source can be arranged in the directions of a row and a column of the memory cells to thereby effectively reduce the number of bit lines and thus shrink the size of the memory.

Second Embodiment

Figure 3:
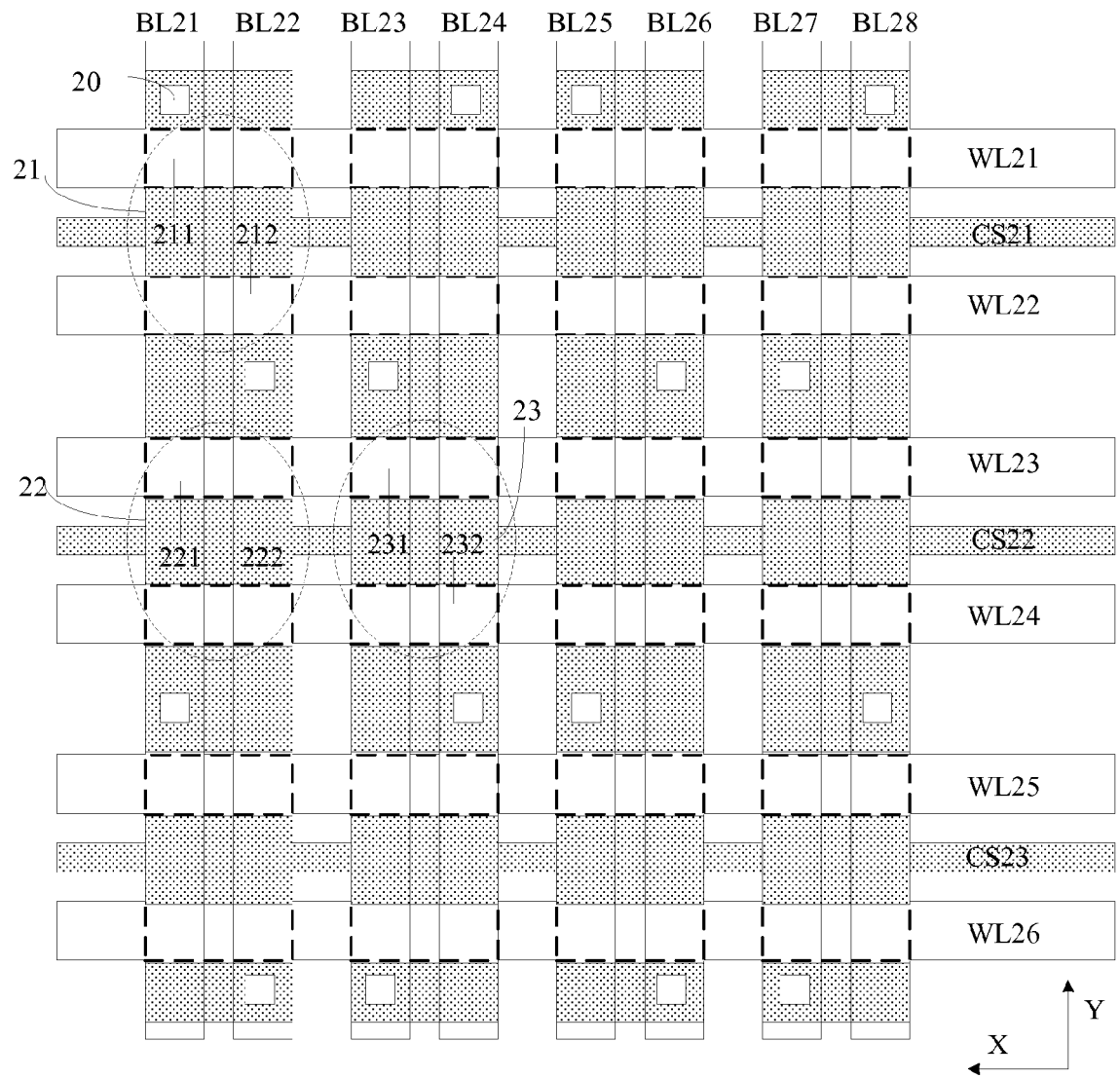
FIG. 3 is a schematic structural diagram of a memory according to another embodiment of the disclosure in a top view.

Referring to FIG. 3, the memory includes an array of memory cells including a plurality of memory cells with a common source, each of the plurality of memory cells with a common source includes two sub-memory cells, each of the sub-memory cells corresponds to a bit line, and the respective bits are electrically independent.

Specifically, the memory cell 21 with a common source includes a sub-memory cell 211 corresponding to a bit line BL21 and a sub-memory cell 212 corresponding to a bit line BL22 as illustrated in FIG. 3. The respective sub-memory cells and their corresponding bit lines are electrically connected respectively through connection nodes 20. Moreover the respective lines (BL21 to BL28) are electrically independent of each other, in other words, the respective bit lines (BL21 to BL28) are not electrically connected with each other, in this embodiment.

Further referring to FIG. 3, the memory further includes a plurality of word lines (WL21 to WL26) and a plurality of common source lines (CS21, CS22 and CS23) in this embodiment. The respective word lines (WL21 to WL26) and the respective common source lines (CS21, CS22 and CS23) are arranged in line respectively in the array of memory cells, i.e., the direction X illustrated in FIG. 3.

Particularly the common source lines (CS21, CS22 and CS23) and the respective word lines (WL21 to WL26) are structurally similar to the common source lines (CS11, CS12 and CS13) and the respective word lines (WL11 to WL16) in the first embodiment, and thus a repeated description thereof will be omitted here.

In the memory of this embodiment, two adjacent sub-memory cells in adjacent memory cells with a common source in the direction of a column of the array of memory cells (i.e., the direction Y illustrated in FIG. 3) share a bit line.

Specifically the memory cell 21 with a common source and the memory cell 22 with a common source are a pair of adjacent memory cells located in the direction of a column of the array of memory cells, where the memory cell 21 with a common source includes a sub-memory cell 211 and a sub-memory cell 212, and the memory cell 22 with a common source includes a sub-memory cell 221 and a sub-memory cell 222, and the sub-memory cell 212 is adjacent to the sub-memory cell 221, referring to FIG. 3. That is, the sub-memory cell 212 and the sub-memory cell 221 share the bit line BL22 this embodiment. In this embodiment, the memory cells with a common source in this structure extend in parallel in the direction of a column.

Moreover in this embodiment, two adjacent columns of memory cells with a common source in the direction of a row of the array of memory cells (i.e., the direction X illustrated in FIG. 3) are connected with bit lines in a mirrored-symmetric way. Referring to FIG. 3, the memory cell 22 with a common source and the memory cell 23 with a common source are adjacent in the direction of a row of the array of memory cells and connected with their respective bit lines in a mirrored-symmetric way. More specifically the locations of the two connection nodes in the memory cell 22 with a common source are mirrored-symmetric to those of the two connection nodes in the memory cell 23 with a common source. In this embodiment, the memory cells with a common source in this structure extend in parallel in the direction of a row.

The memory in this embodiment is structurally similar in other respects to the memory in the first embodiment, and thus a repeated description thereof will be omitted here.

In this embodiment, each of the sub-memory cells in the memory cells with a common source corresponds to a bit line, and the respective bit lines are electrically independent. Thus the memory in this embodiment can also effectively avoid crosstalk between the respective adjacent sub-memory cells during a program operation. Moreover two adjacent sub-memory cells in a memory cell with a common source in the direction of a column of the array of memory cells share a bit line to thereby effectively reduce the number of bit lines and thus shrink the size of the memory.

The memory according to the disclosure has been introduced above in details in the two embodiments but will not be structurally limited to the foregoing description of the disclosure, and the memory cells of the memory can also be modified otherwise in the direction of a row and the direction of a column in other embodiments without departing from the scope of the disclosure.

Correspondingly an embodiment of the disclosure further provides a method of operating the foregoing memory, the method including: applying a word line voltage on word lines of two sub-memory cells with a common source; applying a common source line voltage on a common source line; and applying a corresponding bit line voltage or bit line current on two bit lines corresponding to the two sub-memory cells with a common source, where the two sub-memory cells with a common source correspond respectively to the two word lines and the two bit lines, and the two word lines are electrically independent of each other and the two bit lines are electrically independent of each other.

Particularly during programming of one of the two sub-memory cells with a common source, a supply voltage is applied on the bit line corresponding to the other sub-memory cell.

During a practical operation, a supply voltage, e.g., 3V, can be applied on a bit line corresponding to a sub-memory cell which will not be programmed to thereby effectively avoid the sub-memory cell which is not programmed from being subject to crosstalk from a programmed sub-memory cell.

Particularly applying the corresponding bit line voltage or bit line current on the two bit lines corresponding to the two sub-memory cells with a common source can include applying the same bit line voltage or the same bit line current concurrently on the two bit lines corresponding to the two sub-memory cells with a common source during programming of the memory.

In this operation mode, the two sub-memory cells with a common source can be programmed concurrently instead of being programmed separately.

Moreover applying the corresponding bit line voltage or bit line current on the two bit lines corresponding to the two sub-memory cells with a common source can include applying the same read voltage or read current concurrently on the bit lines of the sub-memory cells with a common source to concurrently read out data in the sub-memory cells with a common source.

Moreover an embodiment of the disclosure further provides a method of operating a memory, the method including: applying a word line voltage on word lines corresponding to two sub-memory cells with a common source; applying a common source line voltage on a common source line; and applying a corresponding bit line voltage or bit line current on two bit lines corresponding to the two sub-memory cells with a common source, where the two sub-memory cells with a common source correspond to the two bit lines, and the two bit lines are electrically independent; and the word lines corresponding to the two sub-memory cells with a common source are connected.

Optionally during programming of one of the two sub-memory cells with a common source, a supply voltage is applied on the bit line corresponding to the other sub-memory cell.

The foregoing operating method will be further described below in details with reference to FIG. 2.

For the sake of a convenient description, firstly assumed the sub-memory cell 101 in the memory cell 10 with a common source illustrated in FIG. 2 is to be programmed. In this embodiment, the sub-memory cell 101 in the memory cell 10 with a common source corresponds to the word line WL11, and the sub-memory cell 102 corresponds to the word line WL12, and the word line WL11 and the word line WL12 are connected with each other, so that a common word line voltage can be applied to the two sub-memory cells 101 and 102 in the memory cell 10.

During programming of the sub-memory cell 101 in the memory cell 10, a common word line program voltage, e.g., 1.5V, is applied on the word lines W11 and W12 to select the sub-memory cell 101; a source voltage, e.g., 9V, is applied on the common source line CS11; and also a bit line program voltage Vb1, e.g., 0.8V, is applied on the bit line BL11 corresponding to the sub-memory cell 101; and moreover a source voltage Vdd, e.g., 3V, is applied on the bit line BL12 corresponding to the sub-memory cell 102 in order to avoid the sub-memory cell 102 from being subject to crosstalk during programming of the sub-memory cell 101.

Under the foregoing condition, there is a significant voltage difference (−1.5V) between the word line voltage (the voltage on the word line WL12) and the bit line voltage (the voltage on the bit line BL12) of the sub-memory cell 102 so that the sub-memory cell 102 is in a good OFF status and insusceptible to the programming operation on the sub-memory cell 101.

It shall be noted that corresponding bit line currents instead of the bit line voltage in the foregoing example can alternatively be applied on a bit line corresponding to a memory cell to perform various operations on the memory cell in other embodiments.

During reading of the sub-memory cell 101 and the sub-memory cell 102, a 0V voltage can be applied on the common source line CS11; a word line read voltage is applied on their respective word lines WL11 and WL12; and also a first bit line read voltage is applied on the bit line BL11, and a second bit line read voltage is applied on the bit line BL12. At this time the first bit line read voltage can be the same as the second bit line read voltage. Under this condition, data in the sub-memory cells 101 and 102 can be read out concurrently instead of being read separately to thereby effectively improve the read efficiency.

Moreover as illustrated in FIG. 2, nonadjacent sub-memory cells in the same column of adjacent memory cells with a common source share a bit line, where the sub-memory cell 101 and the sub-memory cell 111 share the same bit line BL11 as illustrated in FIG. 2. In this structure, the word lines (WL11 and WL13) and the common source lines (CS11 and CS12) corresponding to the sub-memory cell 101 and the sub-memory cell 111 can alternatively be arranged respectively to program or read the sub-memory cells 101 and 111, thereby further improving the efficiency of programming or reading the memory.

It shall be noted the method of operating the memory in the other embodiment is similar to the foregoing operating method, and a repeated description thereof will be omitted here.

Although the disclosure has been disclosed as above in the preferred embodiments, the disclosure will not be limited thereto. Those skilled in the art can make various modifications and variations without departing from the sprit and scope of the disclosure, and therefore the scope of the disclosure shall be as defined in the appended claims.

What is claimed is:

1. A memory, comprising an array of memory cells including a plurality of memory cells with a common source, wherein each of the plurality of memory cells with a common source includes two sub-memory cells, each of the sub-memory cells corresponds to a bit line, and the respective bit lines are electrically independent, and wherein each sub-memory cell comprises a diffusion area, and two adjacent sub-memory cells of two adjacent memory cells in the direction of a column of the array of memory cells share a diffusion area and a bit line.

2. The memory according to claim 1, wherein the two sub-memory cells of the memory cell with a common source share a word line.

3. The memory according to claim 2, wherein the two sub-memory cells of adjacent memory cells with a common source in the direction of a column of the array of memory cells share a bit line.

4. The memory according to claim 2, wherein two adjacent columns of memory cells with a common source in the direction of a row of the array of memory cells are connected with the bit lines in a mirrored-symmetric way.

5. The memory according to claim 2, wherein two adjacent columns of memory cells with a common source in the direction of a row of the array of memory cells are connected with the bit lines in the same way.

6. The memory according to claim 2, further comprising a plurality of common source lines electrically connected with each other.

7. The memory according to claim 2, further comprising a plurality of common source lines, one of which the two sub-memory cells with a common source share and which are electrically independent of each other.

8. The memory according to claim 2, comprising a polysilicon memory, an SONOS memory or a nano-crystal memory.

9. The memory according to claim 1, wherein two adjacent columns of memory cells with a common source in the direction of a row of the array of memory cells are connected with the bit lines in a mirrored-symmetric way.

10. The memory according to claim 1, wherein two adjacent columns of memory cells with a common source in the direction of a row of the array of memory cells are connected with the bit lines in the same way.

11. The memory according to claim 1, further comprising a plurality of common source lines electrically connected with each other.

12. The memory according to claim 1, further comprising a plurality of common source lines, one of which the two sub-memory cells with a common source share and which are electrically independent of each other.

13. The memory according to claim 1, comprising a polysilicon memory, an SONOS memory or a nano-crystal memory.

14. A method of operating a memory, comprising: applying a word line voltage on word lines of two sub-memory cells with a common source; applying a common source line voltage on a common source line; and applying a corresponding bit line voltage or bit line current on two bit lines corresponding to the two sub-memory cells with a common source, wherein the two sub-memory cells with a common source correspond respectively to the two word lines and the two bit lines, and the two word lines are electrically independent of each other and the two bit lines are electrically independent of each other, and wherein during programming of one of the two sub-memory cells with a common source, a supply voltage is applied on the bit line corresponding to the other sub-memory cell.

15. The method of operating a memory according to claim 14, wherein applying the corresponding bit line voltage or bit line current on the two bit lines corresponding to the two sub-memory cells with a common source comprises: applying the same bit line voltage or the same bit line current concurrently on the two bit lines corresponding to the two sub-memory cells with a common source during programming of the memory.

16. The method of operating a memory according to claim 14, wherein applying the corresponding bit line voltage or bit line current on the two bit lines corresponding to the two sub-memory cells with a common source comprises: applying the same read voltage or read current concurrently on the bit lines of the sub-memory cells with a common source to concurrently read out data in the sub-memory cells with a common source.

17. A method of operating a memory, comprising: applying a word line voltage on word lines corresponding to two sub-memory cells with a common source; applying a common source line voltage on a common source line; and applying a corresponding bit line voltage or bit line current on two bit lines corresponding to the two sub-memory cells with a common source, wherein the two sub-memory cells with a common source correspond to the two bit lines, and the two bit lines are electrically independent; and the word lines corresponding to the two sub-memory cells with a common source are connected, and wherein during programming of one of the two sub-memory cells with a common source, a supply voltage is applied on the bit line corresponding to the other sub-memory cell.

* * * * *